US012663478B2

(12) United States Patent
Zoske et al.

(10) Patent No.: US 12,663,478 B2
(45) Date of Patent: Jun. 23, 2026

(54) BATTERY-MONITORING UNIT

(71) Applicant: Webasto SE, Stockdorf (DE)

(72) Inventors: Martin Zoske, Stockdorf (DE); Hans Beyer, Stockdorf (DE); Jonas Keutmann, Stockdorf (DE); Felix König, Stockdorf (DE)

(73) Assignee: Webasto SE, Stockdorf (DE)

( * ) Notice: Subject to any disclaimer, the term of this patent is extended or adjusted under 35 U.S.C. 154(b) by 177 days.

(21) Appl. No.: 18/281,506

(22) PCT Filed: Mar. 14, 2022

(86) PCT No.: PCT/EP2022/056485
§ 371 (c)(1),
(2) Date: Sep. 11, 2023

(87) PCT Pub. No.: WO2022/189671
PCT Pub. Date: Sep. 15, 2022

(65) Prior Publication Data
US 2024/0151777 A1 May 9, 2024

(30) Foreign Application Priority Data

Mar. 12, 2021 (DE) .......................... 102021106060.5

(51) Int. Cl.
G01R 31/3842 (2019.01)
G01R 19/10 (2006.01)
(Continued)

(52) U.S. Cl.
CPC ......... G01R 31/3842 (2019.01); G01R 19/10 (2013.01); G01R 19/16542 (2013.01);
(Continued)

(58) Field of Classification Search
CPC ................ G01R 31/3842; G01R 19/10; G01R 19/16542; G01R 31/3646; G01R 31/396;
(Continued)

(56) References Cited

U.S. PATENT DOCUMENTS

| | | | |
|---|---|---|---|
| 6,064,179 A | 5/2000 | To et al. | |
| 6,121,752 A * | 9/2000 | Kitahara | H02J 7/005 |
| | | | 320/122 |

(Continued)

FOREIGN PATENT DOCUMENTS

| | | |
|---|---|---|
| DE | 102013215628 A1 | 2/2015 |
| DE | 102017218560 A1 | 4/2019 |

(Continued)

OTHER PUBLICATIONS

International Search Report and Written Opinion of PCT/EP2022/056485, mailed Jul. 4, 2022.

*Primary Examiner* — Daniel R Miller

(74) *Attorney, Agent, or Firm* — Command IP LLP; Michael Zarrabian

(57) ABSTRACT

The present invention relates to a battery-monitoring unit, comprising an interface which is configured to receive electrical voltages for each battery group comprising at least two battery cells being connected to each another in parallel and of a battery coupled with the battery-monitoring unit and comprising at least two battery groups, where an evaluation unit is provided which is configured to compare the voltages, received from the interface, of at least two series-connected battery groups with each another and to output a signal based on the result of the comparison.

15 Claims, 2 Drawing Sheets

(51) Int. Cl.

| | |
|---|---|
| *G01R 19/165* | (2006.01) |
| *G01R 31/36* | (2020.01) |
| *G01R 31/396* | (2019.01) |
| *H01M 10/42* | (2006.01) |
| *H01M 10/48* | (2006.01) |
| *H01M 50/512* | (2021.01) |

(52) U.S. Cl.

CPC ....... *G01R 31/3646* (2019.01); *G01R 31/396* (2019.01); *H01M 10/425* (2013.01); *H01M 10/482* (2013.01); *H01M 50/512* (2021.01); *H01M 2010/4271* (2013.01)

(58) Field of Classification Search

CPC .......... G01R 19/16576; G01R 19/1659; G01R 31/385; G01R 31/389; G01R 31/392; H01M 10/425; H01M 10/482; H01M 50/512; H01M 2010/4271; H01M 50/213; H01M 2220/20; Y02E 60/10; B60L 58/10

See application file for complete search history.

(56) References Cited

U.S. PATENT DOCUMENTS

| | | | | |
|---|---|---|---|---|
| 2010/0004885 A1* | 1/2010 | Nakanishi | .......... | G01R 31/3842 |
| | | | | 324/426 |
| 2011/0089897 A1* | 4/2011 | Zhang | .................... | B60L 58/22 |
| | | | | 320/116 |
| 2013/0200856 A1* | 8/2013 | Zhang | .................... | B60L 58/18 |
| | | | | 320/150 |
| 2017/0366005 A1* | 12/2017 | Isshiki | .................... | H02J 7/005 |
| 2019/0187221 A1* | 6/2019 | Mukuno | ............. | G01R 31/367 |
| 2021/0111568 A1* | 4/2021 | Cho | .................... | H01M 50/572 |

FOREIGN PATENT DOCUMENTS

| | | | | | |
|---|---|---|---|---|---|
| DE | 102018213991 A1 | | 2/2020 | | |
| EP | 2649700 A1 | | 10/2013 | | |
| EP | 2806482 A1 | | 11/2014 | | |
| EP | 3370992 A1 | | 9/2018 | | |
| JP | 2008027658 A | * | 2/2008 | | |
| JP | 2020136247 A | * | 8/2020 | | |
| WO | WO-2012132246 A1 | * | 10/2012 | .......... | B60L 11/1816 |

* cited by examiner

BATTERY-MONITORING UNIT

CROSS-REFERENCE TO RELATED APPLICATIONS

This application is a 35 U.S.C. § 371 National Stage Entry of International Application No. PCT/EP2022/056485 filed Mar. 14, 2022, which claims the priority benefit of German Patent Application Serial Number DE 10 2021 106 060.5 filed Mar. 12, 2021, all of which are incorporated herein by reference in their entirety for all purposes.

TECHNICAL FIELD

The present invention relates to a battery-monitoring unit, in particular for monitoring connections of battery groups being connected in parallel and/or in series and constructed from battery cells being connected to each other in parallel, and also to a corresponding battery or traction battery being constructed from the battery groups for an electric vehicle.

BACKGROUND

In electrochemical energy-storage devices for use as traction batteries, in particular in lithium-ion batteries, multiple battery cells organized into battery groups are typically interconnected in series and/or in parallel to form the battery. Thereby, the desired total capacity and total voltage for the respective end use of the battery is achieved in this cell aggregate, for example for particular traction batteries for electric vehicles and hybrid vehicles.

Voltage taps may be present between the battery groups that are constructed from battery cells being interconnected in parallel to respectively determine the electrical voltage applied to these battery groups. The determined voltage may, for example, be transmitted to a battery management system wherein the occurrence of an overvoltage during charging of the battery cells or of an undervoltage during discharging of the battery cells can be detected and can be accordingly avoided by suitable measures, for example by the termination of the charging process.

Typically, the battery groups in such batteries, in particular for use in hybrid vehicles and electric vehicles, are furthermore interconnected in such a manner that a total voltage of several 100 V is provided, wherein the voltage that is applied to each battery cell normally amounts to only a few volts due to the series connection. However, if faults occur in such batteries, wherein, for example, the electrical connection of some or all of the battery cells in a battery group fail, fractions of the battery voltage or, in extreme cases, even the full battery voltage which in many cases may amount to 800 V and above, would be applied at this point in the circuit. In such a case, this can lead to a short circuit with arcs, which may cause serious damage to the battery or to the entire vehicle.

The failure of battery cells in a battery group may occur successively, which may be associated with a corresponding gradual change in the voltage for the respective battery group.

Although systems are known that cause a shutdown of the battery if a voltage measured for a particular battery group exceeds a nominal value or a value stored in the past, such methods are only reliable to a limited extent. This is because such values may have been established for a certain battery configuration or for a battery series that does not exactly match the individual battery to be monitored in the concrete case. Furthermore, the state of the battery may change considerably over its life time and is influenced, for instance, by its life time, charging and discharging times, application-specific loads, operating times, operating conditions and/or environmental conditions. Accordingly, such general nominal values may not be applicable to the individual battery and/or to the state thereof, such that these values should include larger tolerance ranges. As a result, however, a critical state of the battery may, in certain circumstances, only be determined at a late stage.

Accordingly, there is a need to enable a more accurate battery monitoring that provides an early detection of faults and that can preferably be employed for a plurality of batteries and/or types of battery.

SUMMARY OF THE INVENTION

Starting from the known prior art, it is an object of the present invention is to provide an improved battery monitoring.

This object is achieved by a battery-monitoring unit with the features of claim 1. Advantageous embodiments can be derived from the dependent claims, the description and the Figures.

Accordingly, a battery-monitoring unit is suggested, comprising an interface which is configured to receive electrical voltages via respective voltage taps for each battery group comprising at least two battery cells being connected to each other in parallel of a battery coupled with the battery-monitoring unit and comprising at least two battery groups. According to the invention, an evaluation unit is provided which is configured to compare the received voltages for at least two series-connected battery groups of the battery with each other and to output a signal based on the result of the comparison.

The battery groups may have been formed either as a battery module integrated mechanically and electrically as a unit or as logical units within a battery module or within the battery. The battery group is characterized in that it has been constructed from at least two battery cells interconnected in parallel and comprises its own voltage tap—irrespective of the mechanical structure and the spatial arrangement in the battery.

The same number of battery cells is typically provided for each battery group, wherein the battery cells of the battery group are connected in parallel. If in an operating state of the battery the respective battery cells have the voltage stipulated for the operating state, a comparison of the voltages of the at least two battery groups will result substantially—aside from common measurement fluctuations—in similar voltages. However, should one or more battery cells within a battery group not be functioning as stipulated, the voltage tapped for the battery group will be different from the respective other battery group in the battery-group pair. In other words, by the comparison of the voltages tapped at the voltage taps of at least two series-connected battery groups, even small changes in voltage that deviate from a normal or expected state can be detected.

The comparison of the voltages tapped between the voltage taps of the individual battery groups may be achieved particularly easily by a subtraction of the measured values. The difference is substantially zero, if the battery is being operated as expected in normal operation and the difference then moves away from zero in the event of a difference in the voltages.

The comparison of the voltages tapped between the voltage taps of the battery groups may also be achieved by forming a quotient of the measured values. The quotient is substantially 1 when the battery is being operated in normal operation and the quotient moves away from 1 if the measured voltages diverge.

A comparison of the measured voltages can also be carried out by other computational comparison options.

In this manner, even a slight difference in voltage may indicate, for example, a cell loss or an impending cell loss, so that a very accurate monitoring of the state of the battery is provided. This is particularly advantageous in the case of a high parallelization of battery groups and a corresponding high number of respective parallel-connected battery cells per battery group, especially since this enables an early detection of existing faults that may otherwise result in a critical or even dangerous fault.

As a safety measure, membrane-based current-interrupt devices (CIDs), for example, may be provided in battery cells, which selectively interrupt the electrical contact in the event of an excessive generation of gas within the battery cell—for instance, due to ageing, faults in production, or overloading—and an associated build-up of pressure in the battery cell. An early detection of such an interruption enables the triggering of a chain reaction based on a correspondingly increased flow of current in the remaining battery cells of the respective battery group to be prevented. Safety is hence enhanced considerably. Such a shutdown of one or more battery cells in the battery group can be accordingly detected by means of the suggested battery-monitoring unit.

Furthermore, the battery-monitoring unit enables monitoring of a battery to be generally performed irrespective of a concrete battery configuration. This is because, by virtue of the relative comparison of at least two series-connected battery groups of the battery, a comparison of absolute, individual voltage values with a voltage stipulated for the respective battery group according to type and/or configuration can be dispensed with.

Likewise, the determination of the differential value, for example, for the comparison enables that the outputting of the signal may generally be performed irrespective of the power or of the corresponding battery groups. Any possible changes in the state of the battery over the service life or life time of the battery, e.g. due to its life time, charging and discharging times, application-specific loads, operating times, operating conditions and/or environmental conditions, can likewise be taken into account automatically, since these do not differ significantly for the respective battery groups of a battery during operation. Therefor, an accurate monitoring of the state of the battery is provided, which enables an early detection of faults over the entire life time.

The battery-monitoring unit may e.g. be formed as a separate module or an integrated component in a control unit of a battery. The battery-monitoring unit includes an evaluation unit which evaluates the received voltages or measured values and determines or calculates the corresponding comparison for the at least two series-connected battery groups. The interface may be present as a hardware component, instance e.g., to enable an electrical coupling with respective voltage taps, and/or may comprise, at least partially, a computer-readable logic to transmit corresponding measurement signals or data.

The comparison and, e.g., the determining of the differential value can furthermore be performed for various series-connected battery groups. For instance, the differential value can be determined for battery groups that are not directly adjacent to one another and/or for battery groups that, in turn, have been interconnected from several battery groups and together form a battery group. Respective differential values can be determined substantially simultaneously or successively, so that several differential values can be taken into account in the outputted signal or the signal can be output for each individual differential value.

For instance, in the case of a plurality of battery groups, electrical voltages of non-adjacent battery groups can be compared with each other and this can be repeated for respective subsequent or adjacent battery groups, such that the potential presence of a fault in an individual battery group can be inferred or concluded from these voltage values. However, it may also be provided that several battery groups arranged side by side, for instance, two adjacent battery groups, are compared with a corresponding number of non-matching battery groups that are arranged side by side. In this way, conclusions can be drawn, for example, with respect to the existence or presence of potential faults in a particular region of battery groups.

Likewise, a certain level of safety redundancy may be provided, wherein the comparative value, for example the differential value, of each battery group with one or more battery groups or with all other battery groups is determined individually. By the comparison of all respective battery groups with each other, fluctuations in electrical voltage, for instance, can be masked and the accuracy of the monitoring can be increased further.

The evaluation unit of the battery-monitoring unit is preferably configured to perform a comparison and, for example, to determine the differential value at least for respective adjacent battery groups. The term "adjacent" is to be understood as meaning in the direction of the power terminals or as a successive arrangement of the corresponding voltage taps in series, so that, for instance, an electrical voltage of one battery group is compared with an electrical voltage of another battery group that is arranged precisely one battery group closer to a power terminal.

In this way, any faults that may be present in respect of individual battery groups can be determined and no configuration data are required to associate the tapped voltages with the respective battery groups. In other words, the signal can be output for a specific, individual battery group and equally a very accurate monitoring of the state of the battery can be provided.

The evaluation unit of the battery-monitoring unit is furthermore preferably configured to output the signal if a respective differential value exceeds a predefined threshold value. The threshold value may be characteristic, for instance, of an increase in voltage that corresponds to a voltage for one or more battery cells, wherein the battery cell may e.g. provide a standardized power. Likewise, the threshold value may be chosen for a predefined increase in ohmic resistance, the resistance being characteristic of the presence of a potential fault such as a failure of one or more battery cells. In this regard, the electrical voltage drop across a battery group at a particular flow of current can be measured and the ohmic resistance of this battery group can be inferred or concluded therefrom.

The evaluation unit of the battery-monitoring unit may, alternatively or additionally, also be configured to output the signal if a ratio of the differential value to a voltage value of at least one of the battery groups forming the differential value amounts to 0.01:1.0 to 0.25:1.0, preferably 0.05:1.0 to 0.20:1.0.

In other words, the differential value may be determined as a percentage of a tapped voltage of a particular battery group, preferably of the respective lower voltage, and the signal can be output if this percentage is between 1 percent and 25 percent or between 5 percent and 20 percent of the voltage or exceeds this value. For instance, the signal can be output if the differential value exceeds about 15 percent. The percentage may be predetermined in such a manner that typical fluctuations in voltage for the output of the signal are ignored and a fault is present with sufficient probability or a specific fault is even predefined as a percentage. The percentage may hence be chosen in such a manner that there is an examination or a need for action when it is exceeded.

Another advantage of such an embodiment is that the monitoring of a battery generally be performed irrespective of a battery configuration. Accordingly, no absolute power values or threshold values are required and monitoring of the state of the battery can hence be performed for each type of battery, irrespective of the corresponding configuration of the battery. The percentage can hence serve as threshold value, without corresponding to an absolute voltage value. This is also advantageous with regard to possible changes in the properties of the battery over the service life, especially since it may be assumed that the properties for the respective battery groups change in similar manner over time, for instance as a result of charging cycles and operating conditions. The stipulated ratio or the percentage may be expressive or meaningful for a fault detection, irrespective of the service life.

In order to make the output of the signal even more specific or to take various operating states into account, the differential value can be determined both in the idle state and in the loaded state under a known flow of current and the corresponding differential values can be compared with each other. In this way, the influence of different charge states of the battery cells can be eliminated by calculation and taken into account when the signal is output.

Such an examination may occur permanently or intermittently in regular or normal operation of the battery. Furthermore, any manufacturing defects can also be detected by this means if, for instance, this is checked or examined directly after manufacture in the production plant as an end-of-line inspection.

For instance, defective welded joints for an entire battery group or for a subregion of the battery group can be determined in this way, which may be present, for instance, when corresponding connecting ribs or busbars have not been arranged correctly due to manufacturing faults or manufacturing tolerances and thus all or a large proportion of the welded joints of a battery group or the respective parallel-connected battery cells were not performed correctly. In the event of utilization of the battery, these welded joints would potentially fail as a result of an excessive transition resistance. An examination of the differential values at a low current flow thus has the advantage that such an undesirable and potentially dangerous state can be detected and therefore avoided.

Likewise, process requirements regarding the electrical contacting of the battery cells can be relatively minimized, in particular since faults can be detected reliably in retrospect. Production can hence be simplified or facilitated and potentially be performed faster and more cost-effectively.

The behavior of the respective battery groups or the development thereof over the service life may furthermore be variable and fluctuations or variations may likewise occur, depending upon the operating state. Furthermore, potential faults in individual battery cells may not yet result in the triggering of a current-interrupt device. However, the quality of individual battery cells may deteriorate over the service life of the battery, this quality being reflected in the corresponding voltage.

Accordingly, the evaluation unit of the battery-monitoring unit may be configured to record a progression or course of the respective comparative value, for instance of the differential value, and to output the signal if the progression deviates from a predefined progression. In this way, negative tendencies can be detected at an early stage and the respective battery group can be identified, so that a defective battery cell of this battery group, or the battery group including the defective battery cell, or the battery module including the battery group with the defective battery cell, or the entire battery, can subsequently be exchanged accordingly. The predefined progression may be stored in the battery-monitoring unit and can be taken into account with the recorded progression as part of the comparison and, for instance, of the determination of the differential value or when the signal is output.

For instance, the predefined progression may include an expected progression of the differential value for a particular service life or more complex polynomial progressions may also be stipulated which are compared, e.g. by means of statistical evaluation and correlation, with the recorded progression, wherein the signal can be output if a correlation deviates from a specified tolerance range.

The evaluation unit of the battery-monitoring unit is preferably configured to determine a total resistance for the respective battery group (or plurality of battery groups) based on the respective comparison and e.g. the differential value, the total resistance being characteristic of the operating state of the battery group. In this way, an ohmic resistance expected for the operating state may be inputted into the evaluation of the differential value and into the outputting of the signal, wherein this resistance may be higher, for instance in the case of maximum operation or at full load due to a relatively higher temperature. However, if the total resistance, for instance in normal operation, differs from a stipulated or envisaged total resistance and this resistance is correspondingly higher, the higher total resistance may be characteristic of the presence of a cell failure, such that the signal can be output accordingly.

Furthermore, the evaluation unit of the battery-monitoring unit may comprise a current/voltage characteristic curve and be configured to output the signal based on the respective differential value and the current/voltage characteristic curve. Based on the current/voltage characteristic curve, which e.g. is based on empirical values, a corresponding change in resistance of the respective battery group for the respective particular differential value can be calculated which may be characteristic of the presence of a particular fault. In other words, a more-accurate fault detection can occur based on the characteristic curve.

It may also be provided that a characteristic curve is provided by a central unit such as a server or a central vehicle control system. Accordingly, the evaluation unit of the battery-monitoring unit may preferably be configured to receive characteristic data pertaining to the battery via the interface and to transmit or communicate said data to a central unit and to receive at least one current/voltage characteristic curve from the central unit in response to the transmitted characteristic data, wherein the battery-monitoring unit is configured to output the signal on the basis of the respective differential value and the current/voltage characteristic curve. For transmitting and receiving the corresponding data, the battery-monitoring unit may comprise a communications module or may be communicatively coupled with a communications module of a control unit of the battery. The retrieving of at least one characteristic curve inter alia has the advantage that an updated characteristic curve may be available and that particular characteristic data can be taken into account, such that the characteristic curve for the respective battery can be specified.

The characteristic data may comprise a battery type, a number of parallel-connected battery cells per battery group, a cell type, a number of series-connected battery groups, an application of the battery, and/or operating data pertaining to the battery. Accordingly, the characteristic curve can be specified further and this characteristic curve may be tailored to the battery, to the structure thereof, to its use and/or to its development over its service life. Thereby, a change in total resistance, for instance, can be determined very accurately based on the comparison and, for instance, the differential value and the characteristic curve, such that the early detection of potential faults can be improved further. Any threshold values can also be adapted accordingly and tolerance ranges can be reduced.

Furthermore, based on the characteristic data it can also be enabled that only characteristic curves that are relevant for the battery are retrieved. The characteristic curve provided by the central unit may be based on empirical values for electrical voltages actually tapped and/or on comparative data and/or on differential values actually determined for batteries having comparable characteristic data. Accordingly, the battery-monitoring unit is preferably configured to transmit the received electrical voltages and/or the respective comparative data and/or the respective differential values to the central unit, the received current/voltage characteristic curve being based on electrical voltages and/or comparative data and/or differential values evaluated by the central unit for a plurality of batteries having corresponding characteristic data.

For example, data for a plurality of batteries of a corresponding number of vehicles can hence be collected centrally and evaluated in an anonymized manner, wherein characteristic curves are adapted based on the collected data and corresponding battery conditions. The characteristic curve received from the battery-monitoring unit hence preferably corresponds to empirical values for batteries having a corresponding battery state. As a result, a fault detection can occur even more accurately, wherein, based on the (actual) characteristic curve, changes in voltage that are likewise detected and that would otherwise cause the outputting of a signal can be ignored on the basis of the empirical values.

As described above, a corresponding flow of current may be determined based on a current/voltage characteristic curve, which corresponds to the tapped voltage or the comparison, e.g. the determined differential value that is characteristic of a change in voltage. On the basis of the flow of current and the differential value, a total resistance for the respective battery group may hence be calculated or determined, such that more-accurate conclusions with respect to a potentially occurring fault are enabled. In order to determine a potential increase in total resistance even more accurately, the battery-monitoring unit is furthermore preferably configured to receive flows of current from respective current sensors for the at least two series-connected battery groups via the interface and to furthermore output the signal on the basis of the respective flow of current.

Thereby, the number of unknown variables can be reduced and in addition a feedback of a flow of current that is expected based on characteristic curves can be provided, so that the reliability of the signal that is output can be enhanced further.

The evaluation unit of the battery-monitoring unit may also be configured to carry out the comparison and, for example, to determine the comparison and, for example, the respective differential value in real time or at specified time-intervals. In this way, the state of the battery can be monitored continuously, so that in the case of a critical fault a signal can be output immediately. However, since the safety of the battery is enhanced by the battery-monitoring unit and, in particular, by the determination of the respective differential value in such a manner that even slight indications of a fault can be detected, a periodic or intermittent determination of the differential value may also be provided or be sufficient. For instance, the determination of the differential value may occur only in regular operation or in normal operation, the determination preferably being performed within a time-interval from one minute to one hour, more preferably from 5 minutes to 10 minutes.

The signal may comprise a warning, a maintenance signal and/or a control signal for the battery.

For example, based on the determined differential value it can be assessed or determined that at least one battery cell within a particular battery group has failed or appears to be failing within a predefined time. In this case it may potentially suffice that a warning signal is output that draws the attention of a user to the existence or presence of a fault, for example by means of a communications module. Likewise, a maintenance signal, e.g., as part of the warning signal, can be output, so that it is indicated that there is a need for action and, for example, a particular battery group or a battery module should be examined or serviced or a corresponding battery cell, a battery group, a battery module or the entire battery should be exchanged, in order to avoid any potential damage to the battery and to the vehicle.

Furthermore, in the event of e.g. an acute fault a control signal may be output that initiates a protective measure. In this way, a power of the battery can be restricted, so that the maximum current load is limited. The battery may also be isolated from the consumer via a contactor, in order to prevent a flow of current. By virtue of the early detection of faults and the output of a corresponding signal, the safety of the battery and also the functionality of the unaffected components may hence be enhanced considerably. Even if, by virtue of the early detection of potential faults, possible chain reactions of membrane-based current-interrupt devices described above, for example, due to ageing or overloading, can very largely be avoided, such a protective measure may nevertheless be provided to ensure sufficient battery safety in an acute emergency.

The battery-monitoring unit may be suitable for a plurality of applications and types of battery. The battery-monitoring unit is preferably configured for monitoring a traction battery. Thereby, the battery-monitoring unit may be formed, for example, as a module for a traction battery of an electric vehicle.

The above object is further achieved by a traction battery that includes a battery-monitoring unit according to the invention.

The traction battery may, for example, exhibit corresponding series-connected battery groups with respective parallel-connected battery cells, wherein voltage taps that are communicatively and/or electrically coupled with the interface of the battery-monitoring unit are provided for each battery group. Each battery group may furthermore preferably comprise a plurality or multiplicity of cylindrical battery cells. The interface may be present as a stand-alone component of the battery-monitoring unit or as part of a control unit of the traction battery if the monitoring unit has been designed accordingly. The traction battery may further comprise contactors to enable an isolation from the consumer and further comprises power terminals, which may be configured or designed for a particular application of the battery. The traction battery is preferably configured for an electric vehicle.

BRIEF DESCRIPTION OF THE DRAWINGS

Preferred further embodiments of the invention will be explained in more detail by the following description of the Figures.

DETAILED DESCRIPTION OF PREFERRED EMBODIMENTS

In the following, preferred embodiments will be described by reference to the figures. In this regard, identical, similar or like elements in the various Figures are provided with identical reference symbols and a repeated description of these elements will partially be omitted in order to avoid redundancies.

Figures 1, 2:
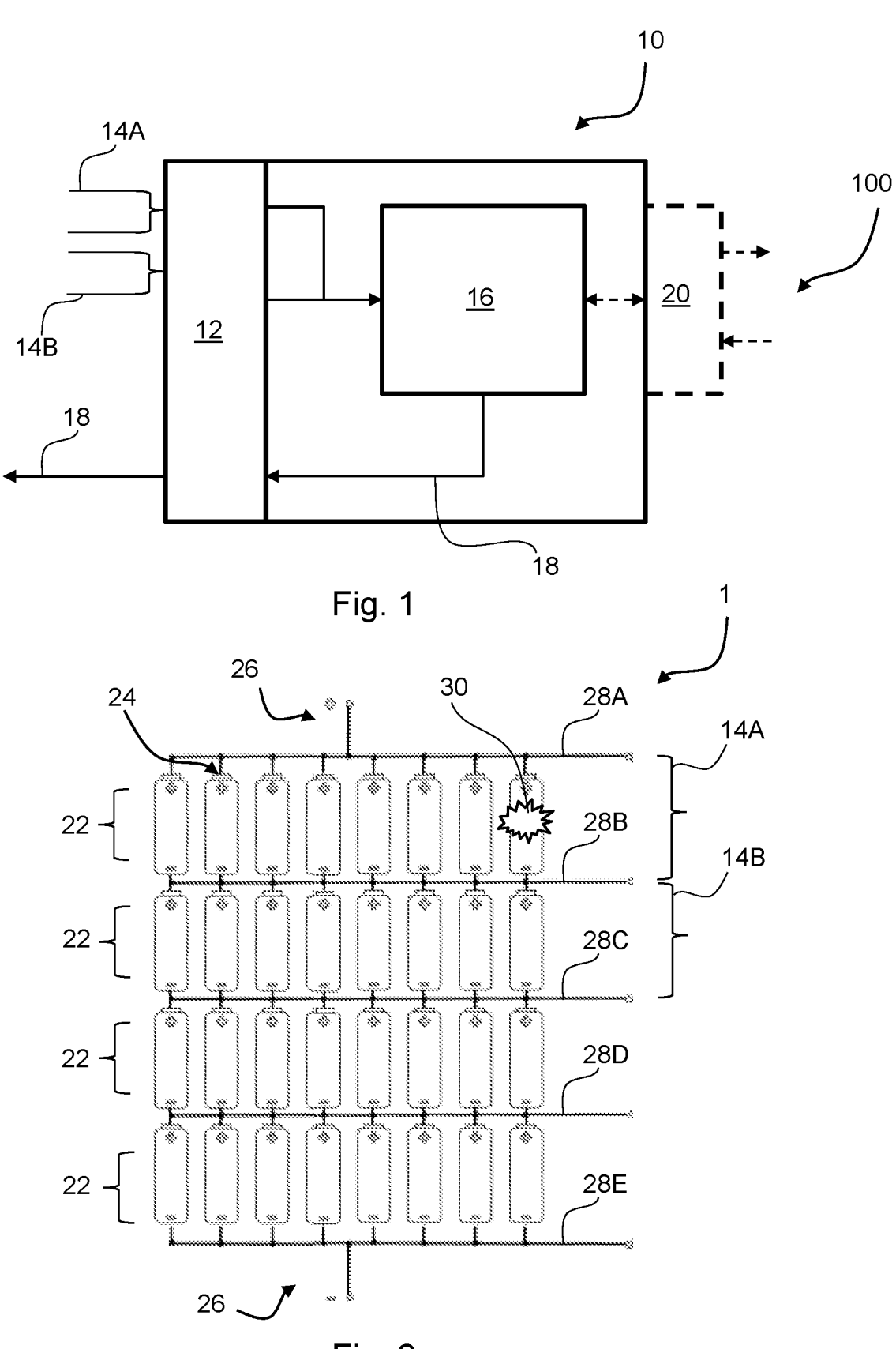
FIG. 1 shows a schematic representation of a battery-monitoring unit.
FIG. 2 shows a schematic representation of an arrangement of series-connected battery groups for providing electrical voltages for adjacent battery groups.

In FIG. 1 a battery-monitoring unit 10 is schematically depicted which is optionally formed as a module that is capable of being communicatively connected to a control unit of a battery. The battery-monitoring unit 10 comprises an interface 12 which is configured to receive voltages 14A, 14B from battery groups 22 of a battery 1 and comprising at least two battery cells 24 being connected to each other in parallel, as indicated schematically by the arrows. The voltages 14A, 14B of the respective battery groups 22 are provided via voltage taps 28A, 28B, . . . , 28E, for example. This will be presented explicitly once again in the following with reference to FIGS. 2 to 4.

A first voltage 14A and a second voltage 14B are received via the interface 12 for two battery groups connected to one another in series and, according to the present embodiment, are received by an evaluation unit 16, wherein the evaluation unit 16 compares the received voltages 14A, 14B with each other and, in the concrete embodiment described here, determines a differential value from the received voltages 14A, 14B. Alternatively, a quotient could also be formed from the voltages 14A, 14B.

The electrical voltages 14A, 14B to be compared with one another can each be measured via two conductors, wherein the battery groups may either be adjacent to one another or spaced apart from one another.

In other words, one or more further battery groups may be present between the battery groups for which an electrical voltage of 14A, 14B is measured. Likewise, the voltages 14A, 14B may also be measured successively for multiple battery groups via respective conductors.

The voltages 14A, 14B may each be measured across one battery group or across a plurality of battery groups, so that, instead of battery-group pairs, multiple battery groups may likewise be compared with a corresponding number of different battery groups, as will be shown in the following Figures.

The differential value is subsequently compared with a threshold value which may be present, for instance, as an absolute value or in the form of a percentage. The absolute value may encompass both a negative value and a positive value, so that both overvoltages and undervoltages can be taken into account for the respective battery group. The determined or retrieved differential value may furthermore be present as a percentage of a tapped electrical voltage of a battery group forming the differential value, preferably of the respective lower voltage, the percentage being compared with the predefined percentage which may hence be regarded as a threshold value.

On the basis of the comparison of the differential value with the threshold value, a signal 18 can accordingly be output via the interface 12 in the case where the threshold value is exceeded. Alternatively, however, it may also be provided that a particular magnitude of differential value or a differential value that is greater than a predefined, minimum differential value, automatically causes the signal 18 to be output, for instance via an appropriate circuit.

In the present case, the signal 18 comprises a warning signal and potentially a control signal, optionally depending on the magnitude of the determined respective differential value. In this way, a warning signal, for instance, can be output if the determined differential value indicates the possibility that one or more battery cells might fail in the foreseeable future, wherein a control signal can be output, particularly when the differential value indicates a potential critical fault.

For instance, the signal 18 can initiate a safety measure by restricting a power of the battery, so that the maximum current load is limited. Likewise, the battery can be isolated from the consumer via a contactor in order to prevent a flow of current and, for instance, the triggering of a chain reaction when a current-interrupt device is being activated.

In FIG. 1 an optional communications module 20 has furthermore been represented which is communicatively and bidirectionally coupled with the evaluation unit 16, as shown by the corresponding arrows. The communications module 20 can, for instance, enable a communication with a central unit 100 and/or with a control device of the battery. Via the communications module 20, further application-specific signals or data can also be transmitted. In this way, a maintenance signal, for instance, can also be transmitted to a maintenance service, wherein a warning signal can be depicted, for instance on a display. The central unit 100 may be, for instance, a central vehicle control system.

Figures 3, 4:
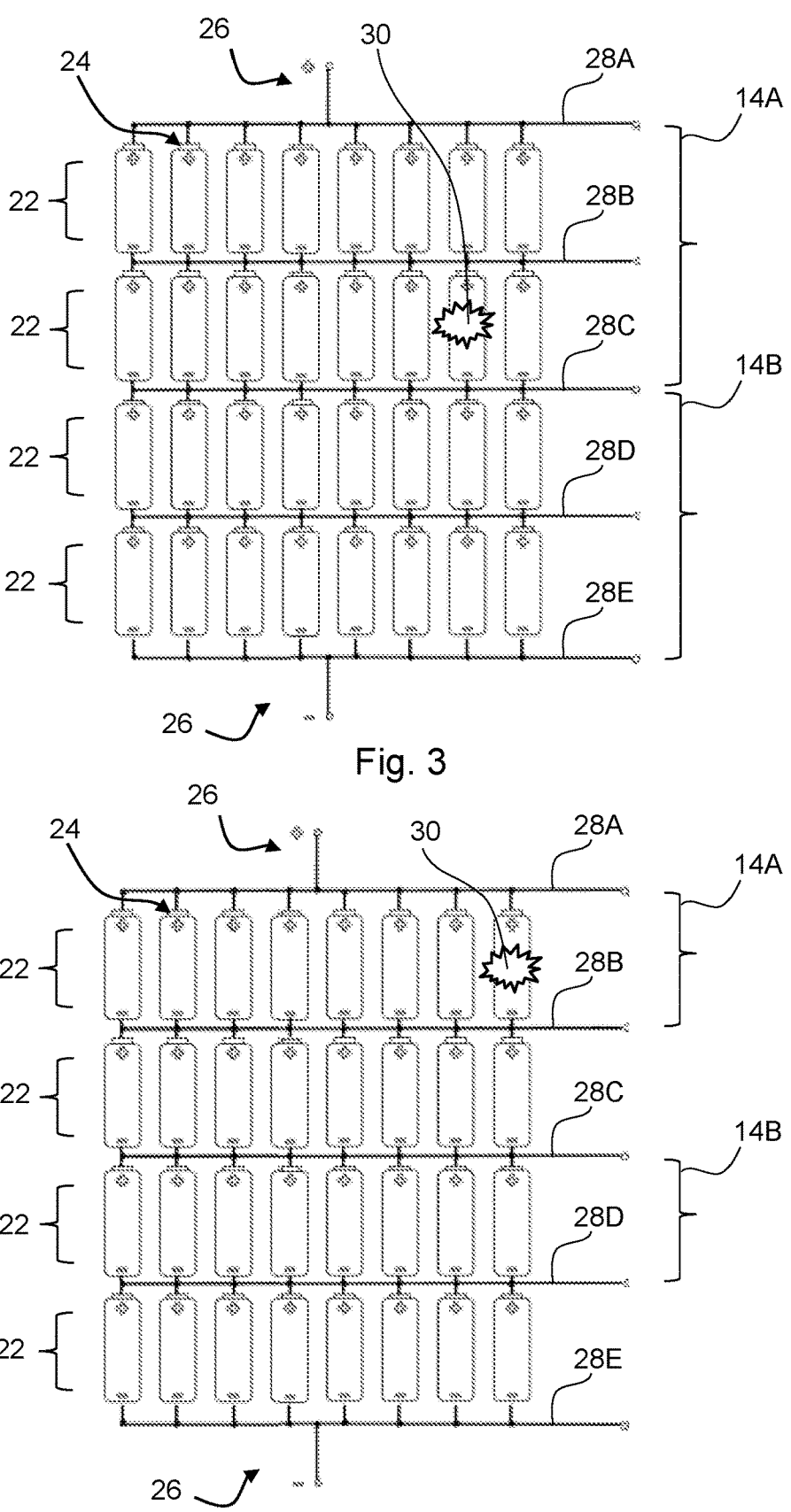
FIG. 3 shows a schematic representation of the arrangement according to FIG. 2 for the alternative provision of voltages for multiple battery groups.
FIG. 4 shows a schematic representation of the arrangement according to FIG. 2 for the alternative provision of voltages for non-adjacent battery groups.

In FIGS. 2 to 4 a schematic representation of an arrangement of series-connected battery groups 22 for constructing a battery 1 is depicted, wherein the load is then connected to the power terminals 26.

The battery groups 22 inter alia provide electrical voltages 14A, 14B for examining their respective operating state, wherein the voltages 14A, 14B can be received by the battery-monitoring unit 10, as shown in FIG. 1, via the interface 12.

In the present case, the arrangement schematically represents a battery module, wherein the number of series-connected battery groups 22 is not to be understood as being restrictive. Each battery group 22 further comprises a predefined number (also not restrictive in the Figures) of battery cells 24, which are connected in parallel within the respective battery group 22.

The battery module that is schematically depicted here may, for example, be designed for constructing a traction battery of an electric vehicle and may accordingly be electrically connected to or coupled with the respective load via the power terminals 26. For the purpose of constructing a battery 1, multiple battery modules are typically present, which, for example, are connected to one another in series or in parallel to provide the desired capacity and nominal voltage.

According to FIG. 2, electrical voltages 14A, 14B are tapped for adjacent battery groups 22 via corresponding voltage taps 28A, 28B, 28C. Accordingly, voltage 14A for the upper battery group 22 in the view is determined via voltage taps or conductors 28A and 28B and voltage 14B for the directly adjacent battery group 22 (arranged directly below in the Figure) is determined via voltage taps 22B and 22C. The differential value, determined by the battery-monitoring unit 10, for the adjacent battery groups 22 enables the signal 18 to be output for a specific or particular individual battery group 22 and a very accurate monitoring of the state of the battery can equally be provided. In the present case, a potential fault within a specific battery group 22 can be determined in this way on the basis of the differential value and the determination of this value for adjacent battery groups 22.

In the present example, a fault 30 is depicted by means of a symbol for the battery cell 24 in the upper battery group 22 that is arranged in the Figure on the right-hand side in the arrangement. Accordingly, the exceeding of a threshold value may indicate an increase in voltage in this particular battery group 22, so that, for instance, a triggered membrane-based current-interrupt device for the battery cell 24 enables an early detection of this fault 30 and further damage due to a potential chain reaction can be avoided.

An alternative determination of the differential value is shown in FIGS. 3 and 4, wherein in the embodiment according to FIG. 3 a tapped electrical voltage 14A for a group of battery groups 22, namely the upper two battery groups 22, is compared with a tapped voltage 14B for a group of the lower two battery groups 22, or is provided. Accordingly, voltage taps 28A and 28C are used for voltage 14A, whereas voltage taps 28C and 28E are used for voltage 14B. By virtue of the multiplicity of the respective battery groups 22, the monitoring can be simplified, wherein, for example, conclusions or assessments can be drawn with respect to the presence of potential faults in a particular region of the battery groups. Such an indication by means of the signal 18 with respect to a region may be advantageous, for instance, for batteries with a high number of series-connected battery groups. Furthermore, by this means a required computing capacity can generally also be reduced or an existing computing capacity can be utilized so that the determination of the differential value and the output of the signal can be performed with improved temporal resolution.

Another alternative is shown in FIG. 4, wherein electrical voltages 14A, 14B for non-adjacent battery groups 22 are received or provided. Such a detection of the voltages 14A, 14B via the voltage taps 24A, 24B and 24C, 24D may be advantageous, for example, if adjacent battery groups 22 can potentially influence one another under particular operating conditions and operational fluctuations can thereby be ignored. In this way, the determined differential value may, under certain circumstances, be more expressive and a threshold that may be present may include a smaller operational tolerance range.

Furthermore, the determination of the differential value can in this way also occur or be performed for successive battery groups 22, whereby, according to this embodiment, voltage 14A for the upper battery group 22 is firstly compared with voltage 14B of the adjacent battery group 22 and subsequently successively with the battery group 22 arranged below it, and so on, to hence provide a certain safety redundancy. Such a successive (or parallel) determination of such differential values is shown, for instance, by the combination of FIGS. 2 and 4. In an advantageous embodiment, voltage 14A is compared with the voltage for all the respective individual battery groups 22. In this way, voltages not only for adjacent battery groups 22 but also for battery-group pairs, the battery groups 22 not being directly adjacent to one another, can be compared with one another in order to determine respective differential values.

Where applicable, all the individual features that have been presented in the embodiments may be combined with one another and/or exchanged without departing from the scope of the invention.

LIST OF REFERENCE NUMERALS

1 Battery
10 Battery-monitoring unit
12 Interface
14A First voltage
14B Second voltage
16 Evaluation unit
18 Signal
20 Communications module
22 Battery group
24 Battery cell
26 Power terminal
28A—Voltage taps
28E
30 Fault
100 Central unit

The invention claimed is:

1. A battery-monitoring unit, including an interface which is coupled to a battery comprising at least two battery groups and which is configured to receive electrical terminal voltages for each battery group comprising at least two battery cells being connected to each other in parallel, further comprising:
an evaluation unit which is configured to receive the terminal voltages from the interface of at least two different and series-connected battery groups and to compare the terminal voltages with each other and to output a signal based on the result of the comparison, wherein the evaluation unit is configured to determine a comparative value of the terminal voltages between the different battery groups received from the interface and to output a signal based on the comparative value, wherein the evaluation unit is configured to determine a change of resistance for the respective battery group on the basis of the comparative value and a current/voltage characteristic curve corresponding to empirical values of a plurality of corresponding second batteries having a corresponding battery state of the battery, wherein the change of resistance is characteristic of a fault presence.

2. The battery-monitoring unit according to claim 1, wherein the comparative value comprises a differential value or a quotient of the terminal voltages of the different battery groups and the evaluation unit is configured to output the signal, if the respective differential value exceeds a predefined threshold value or the respective quotient deviates from 1 by a predefined extent.

3. The battery-monitoring unit according to claim 2, wherein the evaluation unit is configured to output the signal, if a ratio of the differential value to a voltage value of at least one of the battery groups forming the differential value amounts to 0.01:1.0 to 0.25:1.0.

4. The battery-monitoring unit according to claim 3, which is configured to record the progression of the result of the comparison, and to output the signal, if the progression deviates from a predefined progression.

5. The battery-monitoring unit according to claim 3, wherein the evaluation unit-is configured to output the signal, if a ratio of the differential value to a voltage value of at least one of the battery groups forming the differential value amounts to 0.05:1.0 to 0.20:1.0.

6. The battery-monitoring unit according to claim 1, which is configured to receive characteristic data of the battery via the interface and to transmit said data to a central unit and to receive the current/voltage characteristic curve from the central unit in response to the transmitted characteristic data, wherein the evaluation unit is configured to output the signal on the basis of the respective comparison and the current/voltage characteristic curve.

7. The battery-monitoring unit according to claim 6, wherein the characteristic data comprise at least one of: a battery type, a number of parallel-connected battery cells per battery group, a cell type, a number of series-connected battery groups, an application of the battery, and operating data of the battery.

8. The battery-monitoring unit according to claim 4, which is configured to record the progression of the result of the comparison of at least one of: the respective differential value and of the quotient.

9. The battery-monitoring unit according to claim 7, which is configured to transmit at least one of: the received terminal voltages and the respective results of the comparison to the central unit, and wherein the received current/voltage characteristic curve is based on terminal voltages evaluated by the central unit and/or on results of the comparison for a plurality of batteries having corresponding characteristic data.

10. The battery-monitoring unit according to claim 9, which is configured to transmit at least one of: differential values and quotients of the terminal voltages of the different battery groups to the central unit.

11. The battery-monitoring unit according to claim 9, wherein the evaluation unit is further configured to receive flows of current from respective current sensors for the at least two series-connected battery groups via the interface and to continue to output the signal on the basis of the respective flow of current.

12. The battery-monitoring unit according to claim 11, wherein the evaluation unit is configured to perform the respective comparison in at least one of: real time and at predefined time-intervals.

13. The battery-monitoring unit according to claim 12, wherein the signal comprises at least one of: a warning, a maintenance signal, and a control signal for the battery.

14. The battery-monitoring unit according to claim 13, wherein the comparison is respectively performed for adjacent battery groups.

15. A traction battery, comprising a battery-monitoring unit and comprising at least two battery groups, each battery group comprising a plurality of cylindrical battery cells being interconnected in parallel, wherein the battery-monitoring unit includes an interface which is coupled to the battery comprising at least two battery groups and which is configured to receive electrical terminal voltages for each battery group comprising at least two battery cells being connected to each other in parallel, further comprising: an evaluation unit which is configured to receive the terminal voltages from the interface of at least two different and series-connected battery groups and to compare the terminal voltages with each other and to output a signal based on the result of the comparison, wherein the evaluation unit is configured to determine a comparative value of the terminal voltages between the different battery groups received from the interface and to output a signal based on the comparative value, wherein the evaluation unit is configured to determine a change of resistance for the respective battery group on the basis of the comparative value and a current/voltage characteristic curve corresponding to empirical values of a plurality of corresponding second batteries having a corresponding battery state of the battery, wherein the change of resistance is characteristic of a fault presence.

* * * * *